(12) United States Patent
Shu et al.

(10) Patent No.: US 9,355,896 B2
(45) Date of Patent: May 31, 2016

(54) PACKAGE SYSTEMS

(71) Applicant: TAIWAN SEMICONDUCTOR MANUFACTURING COMPANY, LTD., Hsinchu (TW)

(72) Inventors: Chia-Pao Shu, Hsinchu (TW); Chun-wen Cheng, Zhubei (TW); Kuei-Sung Chang, Kaohsiung (TW); Hsin-Ting Huang, Bade (TW); Shang-Ying Tsai, Pingzhen (TW); Jung-Huei Peng, Jhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/815,071

(22) Filed: Jul. 31, 2015

(65) Prior Publication Data
US 2015/0340341 A1    Nov. 26, 2015

Related U.S. Application Data

(60) Continuation of application No. 14/173,406, filed on Feb. 5, 2014, now Pat. No. 9,112,001, which is a division of application No. 13/035,607, filed on Feb. 25, 2011, now Pat. No. 8,674,495, which is a continuation-in-part of application No. 12/900,718, filed on Oct. 8, 2010, now Pat. No. 9,000,578.

(51) Int. Cl.
*H01L 23/48*    (2006.01)
*H01L 21/768*   (2006.01)
(Continued)

(52) U.S. Cl.
CPC ...... *H01L 21/76838* (2013.01); *B81C 1/00238* (2013.01); *B81C 1/00269* (2013.01); *H01L 23/49838* (2013.01); *H01L 23/528* (2013.01); *H01L 23/585* (2013.01); *H01L 24/05* (2013.01); *H01L 24/06* (2013.01); *H01L 24/08* (2013.01); *H01L 24/29* (2013.01); *H01L 24/30* (2013.01); *H01L 24/32* (2013.01); *H01L 24/83* (2013.01); *H01L 25/0657* (2013.01); *B81C 2203/019* (2013.01); *H01L 24/03* (2013.01); *H01L 24/94* (2013.01); *H01L 2224/0345* (2013.01); *H01L 2224/0361* (2013.01); *H01L 2224/0362* (2013.01); *H01L 2224/03452* (2013.01);
(Continued)

(58) Field of Classification Search
CPC .................. H01L 21/76838; H01L 23/49838; H01L 23/528; H01L 23/585; H01L 24/05; H01L 23/06; H01L 24/08; H01L 24/30; H01L 24/32; H01L 24/83; H01L 25/0657
USPC .......... 257/618, 625, 688, 782, 783, E21.122, 257/E23.01; 438/455
See application file for complete search history.

(56) References Cited

U.S. PATENT DOCUMENTS 7,104,129 B2    9/2006    Nasiri et al.
7,442,570 B2    10/2008   Nasiri et al.
(Continued)

*Primary Examiner* — Hung Vu
(74) *Attorney, Agent, or Firm* — Hauptman Ham, LLP

(57) ABSTRACT

A package system includes a first substrate; and a second substrate electrically coupled with the first substrate. The package system further includes a semiconductor material between the first substrate and the second substrate. The semiconductor material includes a pad, and at least one guard ring surrounding the pad and spaced from the pad. The package system further includes a metallic material bonded to the semiconductor material, wherein the metallic material at least partially fills at least one opening in at least one of the first substrate or the second substrate.

20 Claims, 11 Drawing Sheets

(51) Int. Cl.
   *H01L 23/58*    (2006.01)
   *H01L 23/498*   (2006.01)
   *H01L 23/528*   (2006.01)
   *H01L 23/00*    (2006.01)
   *B81C 1/00*     (2006.01)
   *H01L 25/065*   (2006.01)

(52) U.S. Cl.
   CPC ............... *H01L2224/04026* (2013.01); *H01L 2224/05551* (2013.01); *H01L 2224/05555* (2013.01); *H01L 2224/05557* (2013.01); *H01L 2224/05617* (2013.01); *H01L 2224/05638* (2013.01); *H01L 2224/061* (2013.01); *H01L 2224/08145* (2013.01); *H01L 2224/08225* (2013.01); *H01L 2224/26145* (2013.01); *H01L 2224/291* (2013.01); *H01L 2224/2902* (2013.01); *H01L 2224/29011* (2013.01); *H01L 2224/29014* (2013.01); *H01L 2224/29017* (2013.01); *H01L 2224/29101* (2013.01); *H01L 2224/29111* (2013.01); *H01L 2224/29117* (2013.01); *H01L 2224/29124* (2013.01); *H01L 2224/29138* (2013.01); *H01L 2224/29144* (2013.01); *H01L 2224/29147* (2013.01); *H01L 2224/29155* (2013.01); *H01L 2224/29166* (2013.01); *H01L 2224/29181* (2013.01); *H01L 2224/301* (2013.01); *H01L 2224/321* (2013.01); *H01L 2224/32058* (2013.01); *H01L 2224/32106* (2013.01); *H01L 2224/32148* (2013.01); *H01L 2224/83203* (2013.01); *H01L 2224/83365* (2013.01); *H01L 2224/83805* (2013.01); *H01L 2225/06527* (2013.01); *H01L 2924/014* (2013.01); *H01L 2924/0105* (2013.01); *H01L 2924/01013* (2013.01); *H01L 2924/01029* (2013.01); *H01L 2924/01033* (2013.01); *H01L 2924/01049* (2013.01); *H01L 2924/01073* (2013.01); *H01L 2924/01079* (2013.01); *H01L 2924/01322* (2013.01); *H01L 2924/14* (2013.01); *H01L 2924/1461* (2013.01)

(56) References Cited

U.S. PATENT DOCUMENTS

| | | | |
|---|---|---|---|
| 8,089,144 B2 | 1/2012 | Fujii et al. | |
| 8,134,230 B2 * | 3/2012 | Yang | H01L 24/11 257/690 |
| 8,507,913 B2 * | 8/2013 | Nunan | B81C 1/00269 257/616 |
| 2002/0113296 A1 * | 8/2002 | Cho | B81B 7/0077 257/659 |
| 2012/0086126 A1 | 4/2012 | Shu et al. | |

* cited by examiner

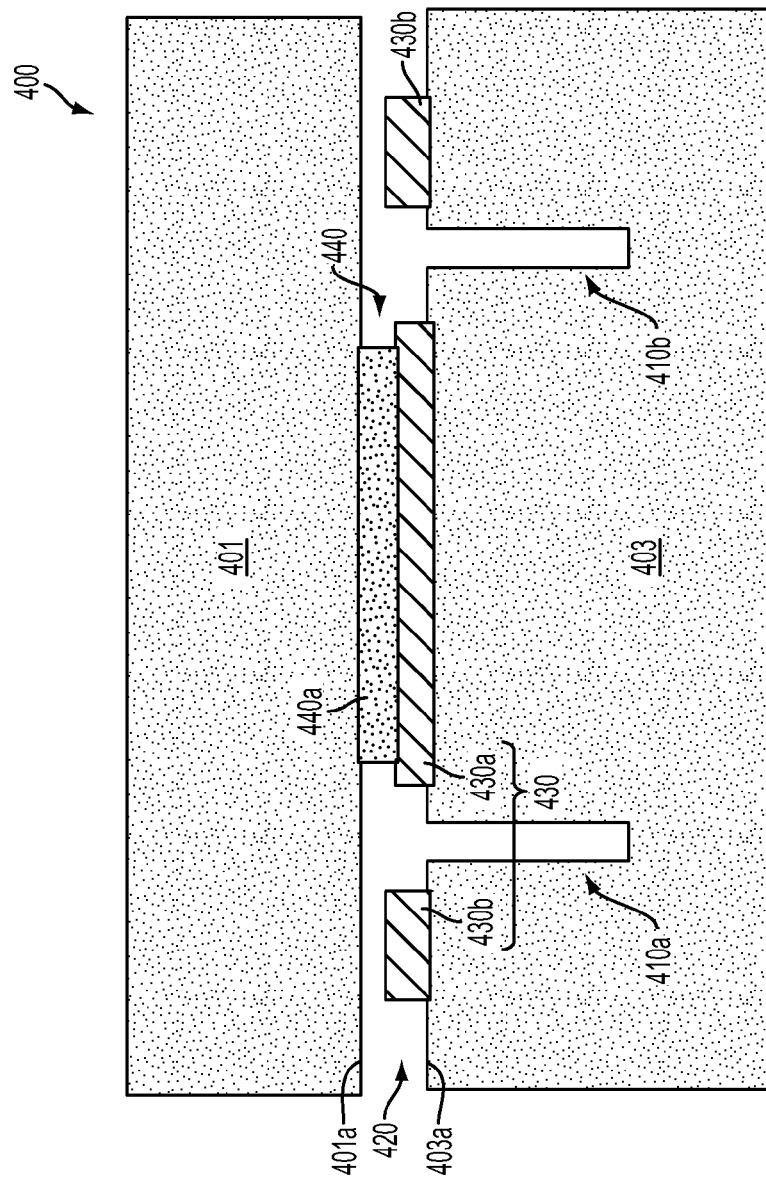

PACKAGE SYSTEMS

PRIORITY CLAIM

The present application is a continuation of U.S. application Ser. No. 14/173,406, filed Feb. 5, 2014, which is a divisional of U.S. application Ser. No. 13/035,607, filed Feb. 25, 2011, now U.S. Pat. No. 8,674,495, issued Mar. 18, 2014, which is a continuation-in-part of U.S. application Ser. No. 12/900,718, filed Oct. 8, 2010, now U.S. Pat. No. 9,000,578, issued Apr. 7, 2015, which are hereby incorporated by reference in their entireties.

TECHNICAL FIELD

The present disclosure relates generally to the field of semiconductor package systems and more, particularly, to package systems and manufacturing methods thereof.

BACKGROUND OF THE DISCLOSURE

Micro electro mechanical system (MEMS) devices are a recent development in the field of integrated circuit technology and include devices fabricated using semiconductor technology to form mechanical and electrical features. Examples of MEMS devices include gears, levers, valves, and hinges. Common applications of MEMS devices include accelerometers, pressure sensors, actuators, mirrors, heaters, and printer nozzles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIGS. 4A-4D and 5 are schematic cross-sectional views of various exemplary package systems.

DETAILED DESCRIPTION OF THE DISCLOSURE

Figure 1:
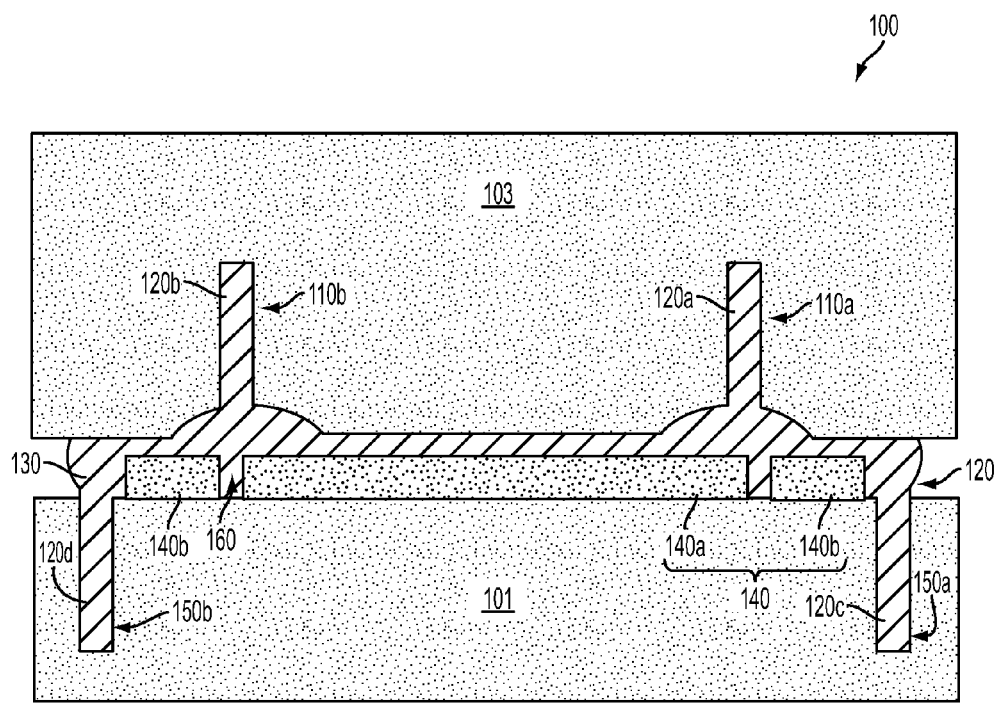
FIG. 1 is a schematic cross-sectional view of an exemplary package system.

A eutectic bonding has been applied to electrically couple two substrates together to form a MEMS device. Generally, the substrates each have a bonding material formed thereon. For example, an aluminum-germanium (Al—Ge) eutectic bonding is formed by eutectic bonding an Al pad on a substrate with a Ge pad on another substrate. During the eutectic bonding, the Al pad is subjected to a thermal treatment and a pressure, such that the Al pad is softened and melted. The pressure of the eutectic bonding presses the material of the Al pad stretching laterally. It is found that the laterally-stretching Al material may contact and be electrically short to neighboring eutectic bonding material.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view of an exemplary package system. In FIG. 1, a package system 100 can include a substrate 101 that can be electrically coupled with a substrate 103. The substrate 103 can include at least one opening, e.g., openings 110a and 110b. The package system 100 can include at least one electrical bonding material, e.g., an electrical bonding material 120, disposed between the substrates 101 and 103. A portion, e.g., portions 120a and 120b, of the electrical bonding material 120 can be at least partially filled in the openings 110a and 110b, respectively.

The substrates 101 and 103 can be assembled to form a hermetic or non-hermetic package system. In some embodiments, the substrates 101 and/or 103 can each be a silicon substrate doped with a P-type or N-type dopant. In other embodiments, the substrates 101 and/or 103 may each alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrates 101 and/or 103 could each include an epitaxial layer (epi layer), may be strained for performance enhancement, and may include a silicon-on-insulator (SOI) structure.

In some embodiments, the substrate 101 can include an integrated circuit (not shown) formed thereon. The integrated circuit can be formed, for example, by a complementary metal-oxide-semiconductor (CMOS) technology. The integrated circuit can include, for example but is not limited to, a logic circuit, an analog circuit, a mixed-signal circuit, and/or any suitable integrated circuit. In some embodiments, the substrate 101 can be referred to as a base substrate.

In some embodiments, the substrate 103 can include another integrated circuit (not shown) formed thereon. The integrated circuit can be similar to that of the substrate 101. In other embodiments, the substrate 103 can include a MEMS device (not shown). The MEMS device can include, for example, an accelerometer, a gyroscope, a mirror for optical applications, a switch or a resonator within a radio frequency (RF) device, a rotational flexure, a translational flexure, and/ or any suitable MEMS device. In still other embodiments, the integrated circuit on the substrate 103 may merely include a conductive wire routing for an electrical connection. In some embodiments, the substrate 103 can be referred to as a cap substrate.

In some embodiments, the openings 110a and 110b can continuously extend in the substrate 103, such that the openings 110a and 110b can meet each other. In other embodiments, the openings 110a and 110b can be discontinuously disposed in the substrate 103. In still other embodiments, the openings 110a and 110b can be trench openings. The openings 110a and 110b do not penetrate all the way through the substrate 103. In some embodiments, the openings 110a and 110b can each have a depth ranging from about 2 µm to about 10 µm. The openings 110a and 110b can each have a width ranging from about 1 µm to about 2 µm. It is noted that the dimensions of the openings 110a and 110b are merely exemplary. The dimensions can be modified.

In some embodiments, the electrical bonding material 120 can be a eutectic bonding material, glass bonding material, solder bonding material, or any suitable bonding material. In some embodiment using a eutectic bonding, the electrical bonding material 120 can include at least one material, such as aluminum (Al), copper (Cu), silicon (Si), germanium (Ge), titanium (Ti), tantalum (Ta), gold (Au), nickel (Ni), tin (Sn), other suitable bonding materials, and/or any combinations thereof. In other embodiments, the electrical bonding material 120 can include a metallic material 130 and a semiconductor material 140. The metallic material 130 can be made of, e.g., Al, Cu, Ti, Ta, Au, Ni, Sn, other metallic materials, and/or any combinations. The semiconductor material 140 can be made of, e.g., Ge, Si, other semiconductor material, and/or any combinations thereof. The eutectic bonding between the substrates 101 and 103 can be formed by interacting the metallic material 130 and the semiconductor material 140.

During a eutectic bonding, the metallic material 130 can be softened and/or melted. The openings 110a and 110b are configured to at least partially accommodate the softened metallic material 130. In some embodiments, the softened metallic material 130 can completely fill the openings 110a and 110b as shown in FIG. 1. In other embodiments, the softened metallic material 130 may partially fill the openings 110a and 110b. It is noted that the number of the openings 110a and 110b is merely exemplary. In some embodiments, more openings can be disposed in the substrate 103 for accommodating the metallic material 130.

In some embodiments, the semiconductor material 140 can optionally include a pad 140a and at least one guard ring, e.g., a guard ring 140b. The guard ring 140b can be disposed around the pad 140a. The guard ring 140b can be continuously or discontinuously disposed around the pad 140a. In some embodiments, the guard ring 140b can provide more semiconductor materials to interact with the metallic material 130 that is softened and melted during the eutectic bonding. Though merely showing a single guard ring 140b in FIG. 1, the scope of this application is not limited thereto. In some embodiments, more than one guard ring can be disposed around the pad 140a. In other embodiments, the guard ring 140b can be saved.

Referring again to FIG. 1, in some embodiments, a gap 160 is formed between the pad 140a and the guard ring 140b. In some embodiments, the opening 110a can face at least one of the pad 140a and the gap 160. In some embodiments, the gap 160 can have a width of about 3 µm. In other embodiments, the width of the gap 160 can be more or less than 3 µm.

In some embodiments, the substrate 101 can optionally include at least one opening, e.g., openings 150a and 150b. The openings 150a and 150b can be configured to at least partially accommodate a portion, e.g., portions 120c and 120d, respectively, of the electrical bonding material 120. In some embodiments, the openings 150a and 150b can continuously extend in the substrate 101, such that the openings 150a and 150b can meet each other. In other embodiments, the openings 150a and 150b can be discontinuously disposed in the substrate 101. In still other embodiments, the openings 150a and 150b can be trench openings. The openings 150a and 150b do not penetrate all the way through the substrate 101. In yet still other embodiments, the openings 110a and 150a are misaligned from each other in a direction that is perpendicular to surfaces of the substrates 101 and 103. In some embodiments, the openings 150a and 150b can each have a depth ranging from about 2 µm to about 10 µm. The openings 150a and 150b can each have a width ranging from about 1 µm to about 2 µm. It is noted that the dimensions of the openings 150a and 150b are merely exemplary. The dimensions can be modified.

During the eutectic bonding, the metallic material 130 can be softened and/or melted. The openings 150a and 150b are configured to at least partially accommodate the softened metallic material 130. In some embodiments, the softened metallic material 130 can completely fill the openings 150a and 150b as shown in FIG. 1. In other embodiments, the softened metallic material 130 may partially fill the openings 150a and 150b. It is noted that the number of the openings 150a and 150b is merely exemplary. In some embodiments, more openings can be disposed in the substrate 101 for accommodating the metallic material 130.

It is noted that though showing the openings 150a and 150b disposed around the pad 140a and the guard ring 140b, the scope of the current application is not limited thereto. In some embodiments, the openings 150a and 150b can be disposed around the pad 140a, and the guard ring 140b is not used. In other embodiments, the openings 150a and 150b can be disposed between the pad 140a and the guard ring 140b.

Figure 2:
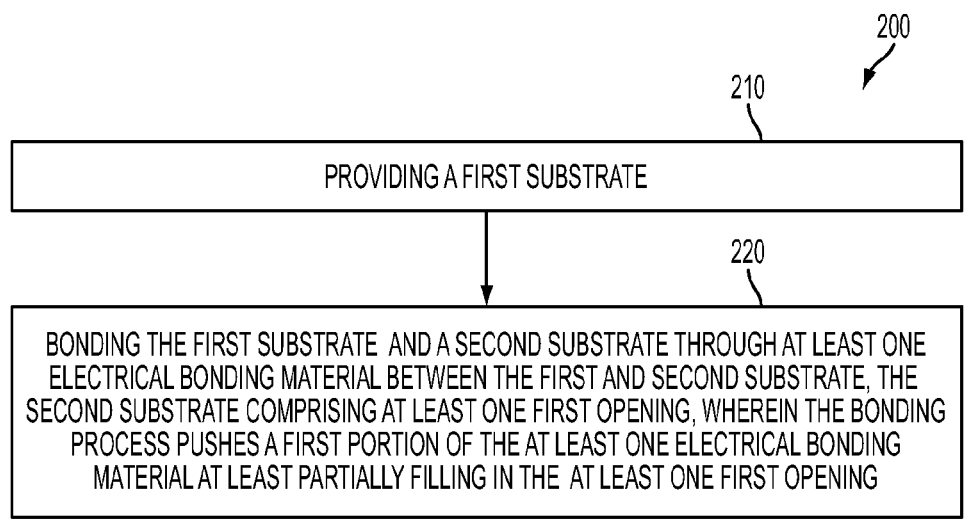
FIG. 2 is a flowchart of an exemplary method of forming a plurality of package systems.

FIG. 2 is a flowchart of an exemplary method of forming a plurality of package systems. FIGS. 3A-3F are schematic cross-sectional views of package systems during various fabrication stages. Items of FIGS. 3A-3F that are the same or similar items in FIG. 1 are indicated by the same reference numerals, increased by 200. It is understood that FIGS. 3A-3F have been simplified for a better understanding of the concepts of the present disclosure. Accordingly, it should be noted that additional processes may be provided before, during, and after the method 200 of FIG. 2, and that some other processes may only be briefly described herein.

Figure 3A:
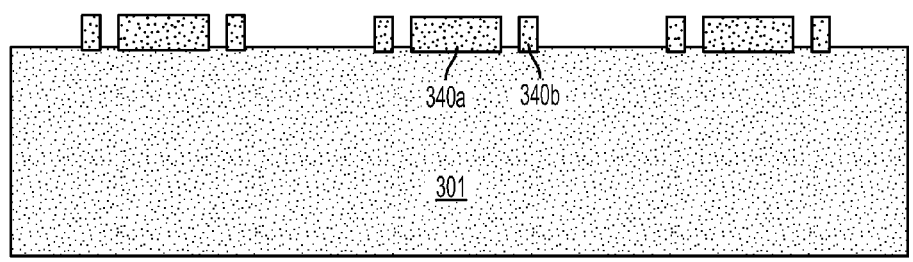
FIGS. 3A-3F are schematic cross-sectional views of package systems during various fabrication stages.

Referring to FIGS. 2 and 3A, the process shown in block 210 can include providing a substrate, e.g., a substrate 301. In some embodiments, pads 340a and guard rings 340b can be patterned on the substrate 301. The pads 340a and guard rings 340b can be formed, for example, by physical vapor deposition (PVD) and/or chemical vapor deposition (CVD), a photolithographic process, and an etch process.

Figure 3B:
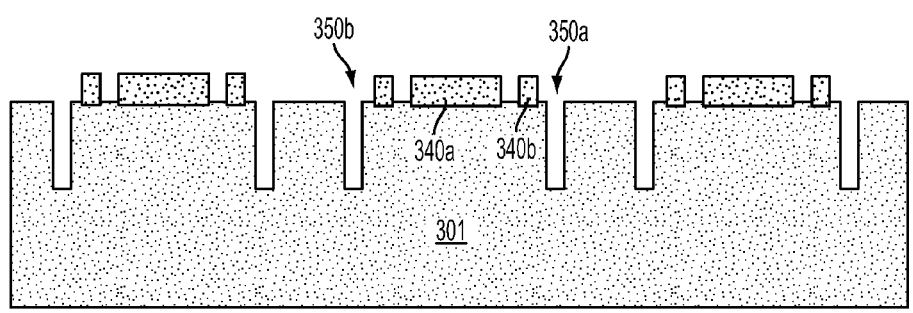

In some embodiments, openings 350a and 350b can be optionally formed in the substrate 301 as shown in FIG. 3B. The openings 350a and 350b can be formed, for example, by a photolithographic process, and an etch process. In some embodiments, the openings 350a and 350b are formed and meet each other in the substrate 301. In some embodiments, the openings 350a and 350b are formed around the pad 340a and the guard ring 340. In other embodiments, the openings 350a and 350b can be each formed between the pad 340a and the guard ring 340b. In still other embodiments, the openings 350a and 350b can be formed around the pad 340a and the guard ring 340b is not used.

Figure 3C:
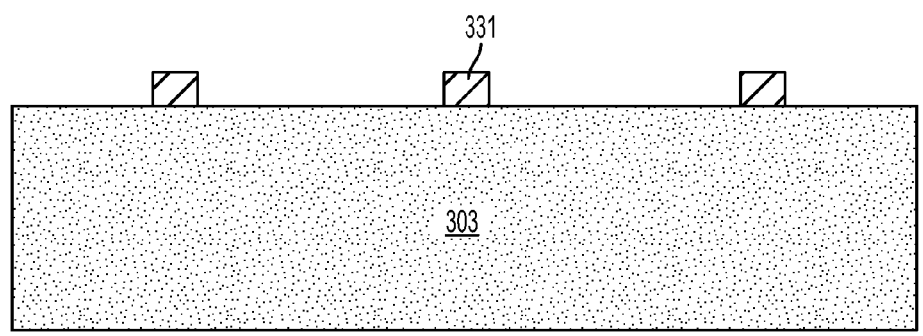

Referring to FIG. 3C, metallic pads 331 can be patterned over a substrate 301. The metallic pads 331 can have a material similar to that of the metallic material 130 described above in conjunction with FIG. 1. The metallic pads 331 can be formed, for example, by physical vapor deposition (PVD) or chemical vapor deposition (CVD), a photolithographic process, and an etch process.

Figure 3D:
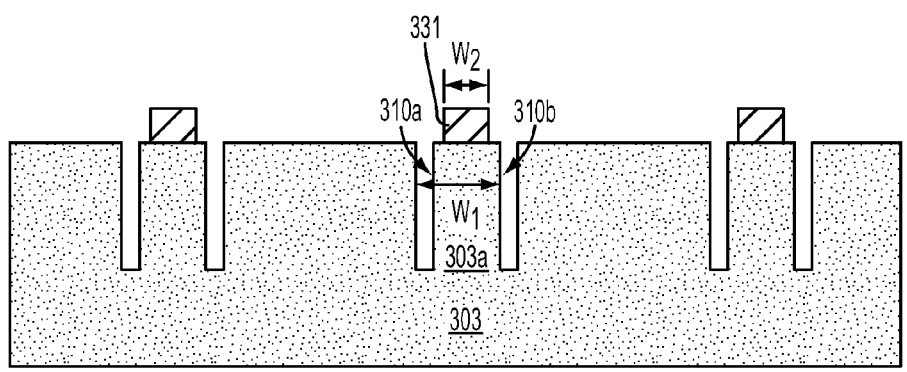

Referring to FIG. 3D, openings 310a and 310b can be formed in the substrate 301. The openings 310a and 310b can be formed, for example, by a photolithographic process, and an etch process. In some embodiments, a width $W_1$ of the substrate 303a below the metallic pad 331 can be larger than a width $W_2$ of the metallic pad 331.

Figure 3E:
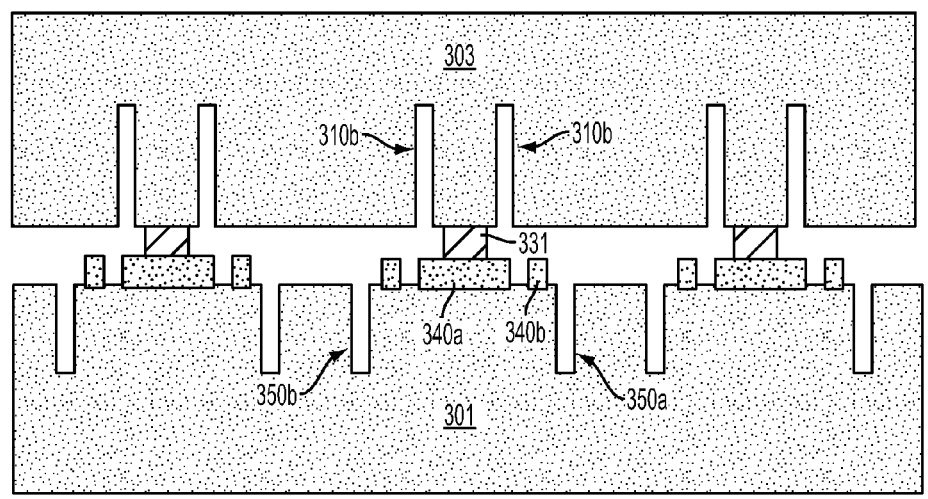
Figure 3F:
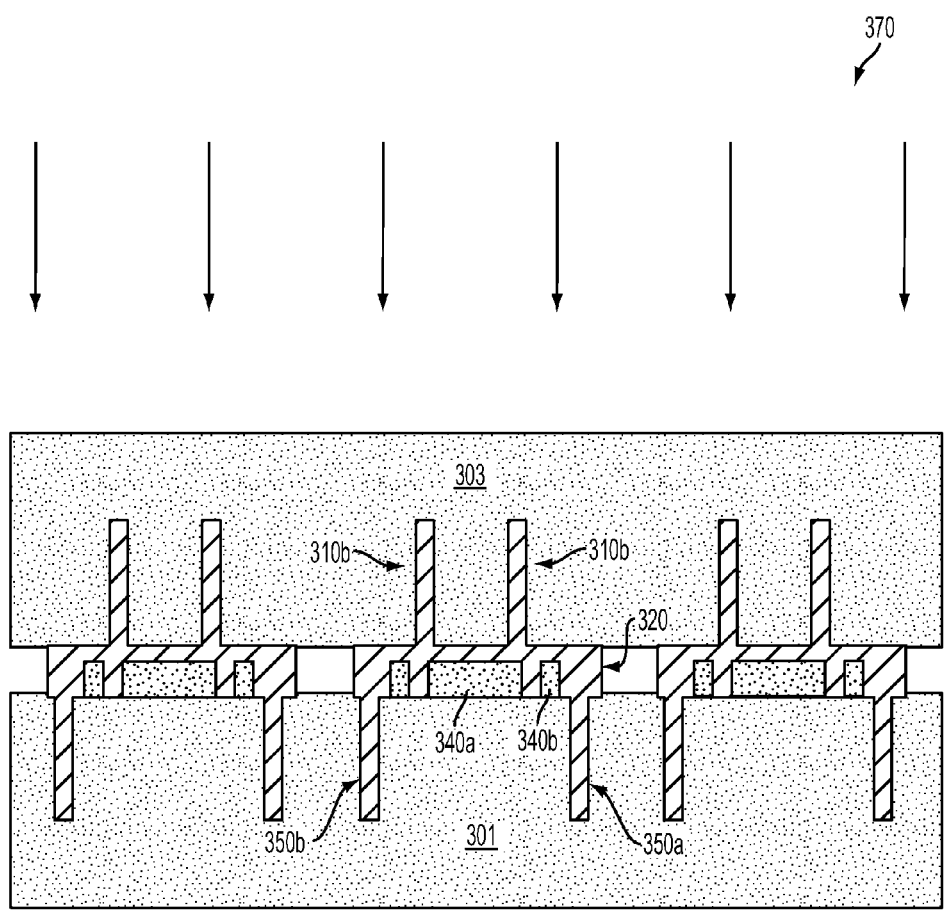

Referring to FIG. 3E, the substrate 303 can be flipped and contact the substrate 301. The metallic pads 331 can be aligned with the respective pads 340a. Referring to FIGS. 2 and 3F, the process shown in block 220 can include bonding the substrate 301 and 303 through at least one electrical bonding material, e.g., an electrical bonding material 320, between the substrate 301 and 303. The bonding process 370 can push a portion of the electrical bonding material 320 at least partially filling in the openings 310a and 310b.

As noted, the bonding process 370 can react the metallic pads 331 with the pads 340a to form electrical bonding, e.g., eutectic bonding. The bonding process 370 can have a process temperature that can soften and/or melt the metallic bonds 331 (shown in FIG. 3E). The bonding process 370 can also press the substrate 303 to the substrate 301. The softened and non-reacted metallic material of the metallic bonds 331 can be at least partially pushed and/or squeezed into the openings 310a and 310b.

It is found that, without the openings 310a and 310b, the non-reacted metallic material of the metallic bonds 331 may contact other non-reacted metallic material of neighboring metallic bonds (not labeled). The metallic materials would be electrically short to each other.

In some embodiments, the optionally-formed guard rings 340b can interact with a portion of the metallic material of the metallic bonds 331. The guard rings 340b can consume and further prevent the non-reacted metallic material of the metallic bonds 331 from contacting other non-reacted metallic materials.

In some embodiments, the optionally-formed openings 350a and 350b can accommodate another portion of the non-reacted metallic material of the metallic bonds 331. The openings 350a and 350b can further prevent the non-reacted metallic material of the metallic bonds 331 from contacting other non-reacted metallic materials.

In some embodiments, the method 200 can include at least one process for grinding and thinning the substrates 301 and 303. The grinding process does not grind the substrate 301 and 303, such that the openings 310a-310b and 350a-350b penetrate all the way through the substrates 303 and 301, respectively. In some embodiments, after the grinding process, the package structure shown in FIG. 3F can be subjected to a dicing process to individualize the package systems.

Figure 4A:
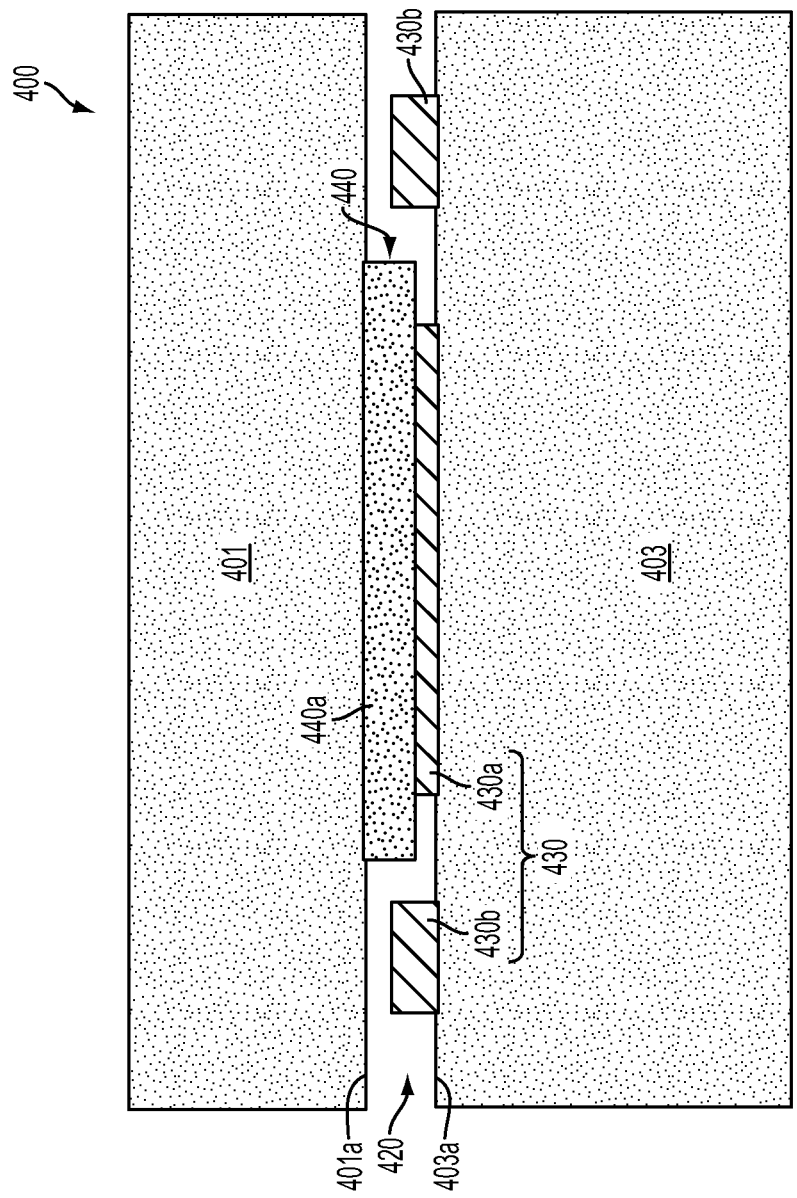

FIG. 4A is a schematic cross-sectional view of another exemplary package system. Items of FIG. 4A that are the same or similar items in FIG. 1 are indicated by the same reference numerals, increased by 300. In FIG. 4A, a package system 400 can include a substrate 401 that can be electrically coupled with a substrate 403. The package system 400 can include at least one electrical bonding material, e.g., an electrical bonding material 420, disposed between the substrates 401 and 403.

In some embodiments, the electrical bonding material 420 can be a eutectic bonding material, glass bonding material, solder bonding material, or any suitable bonding material. In some embodiment using a eutectic bonding, the electrical bonding material 420 can include a metallic material 430 and a semiconductor material 440. The metallic material 430 can be disposed adjacent to a surface 403a of the substrate 403. The semiconductor material 440 can be disposed adjacent to a surface 401a of the substrate 401.

Referring to FIG. 4A, the metallic material 430 can include at least one pad, for example, a pad 430a, and at least one guard ring, a guard ring 430b that is disposed around the pad 430a. In some embodiments, the pad 440a can be wider than the pad 430a as shown in FIG. 4A. In other embodiments, the pad 430a can be wider than the pad 440a as shown in FIG. 4C. In still other embodiments, the width of the pad 430a can be substantially equal to that of the pad 440a.

In some embodiments, the guard ring 430b can be continuously or discontinuously disposed around the pad 430a. Though merely showing a single guard ring 430b in FIG. 4A, the scope of this application is not limited thereto. In some embodiments, more than one guard ring can be disposed around the pad 430a.

During a eutectic bonding, the metallic material 430 can be softened and/or melted. The pad 430a can be eutectic bonded with a pad 440a of the semiconductor material 440. In some embodiments, the electrical bonding material 420 carrying the component, e.g., germanium, of the semiconductor material 440 may laterally flow and adjoin the guard ring 430b. The guard ring 430b can be configured to interact with the carried germanium component in the electrical bonding material 420 and/or prevent the electrical bonding material 420 from further lateral flowing.

Figure 4B:
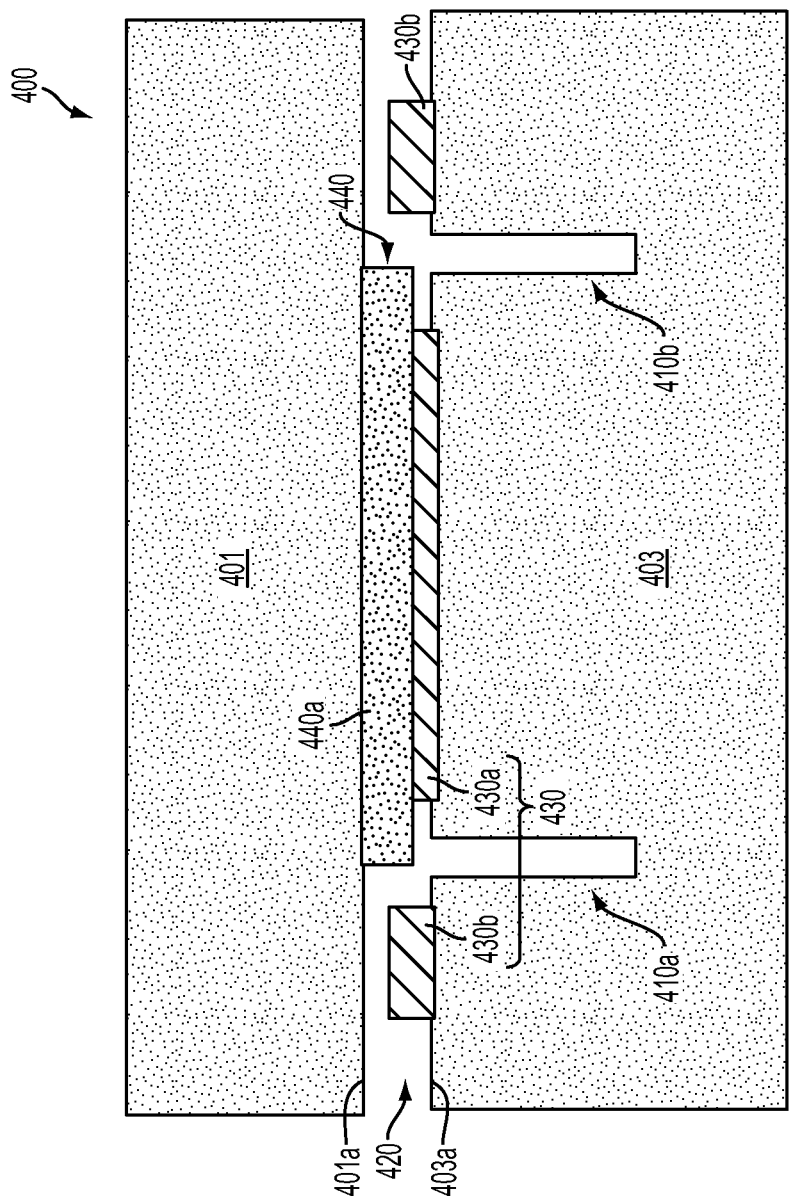

In some embodiments, the substrate 403 can include at least one opening through the surface 403a. For example, openings 410a and 410b can be through the surface 403a and disposed between the pad 430a and the guard ring 430b as shown in FIG. 4B. In other embodiments, the openings 410a and 410b can be through the surface 403a and around the pad 430a and the guard ring 430b.

Figure 4D:
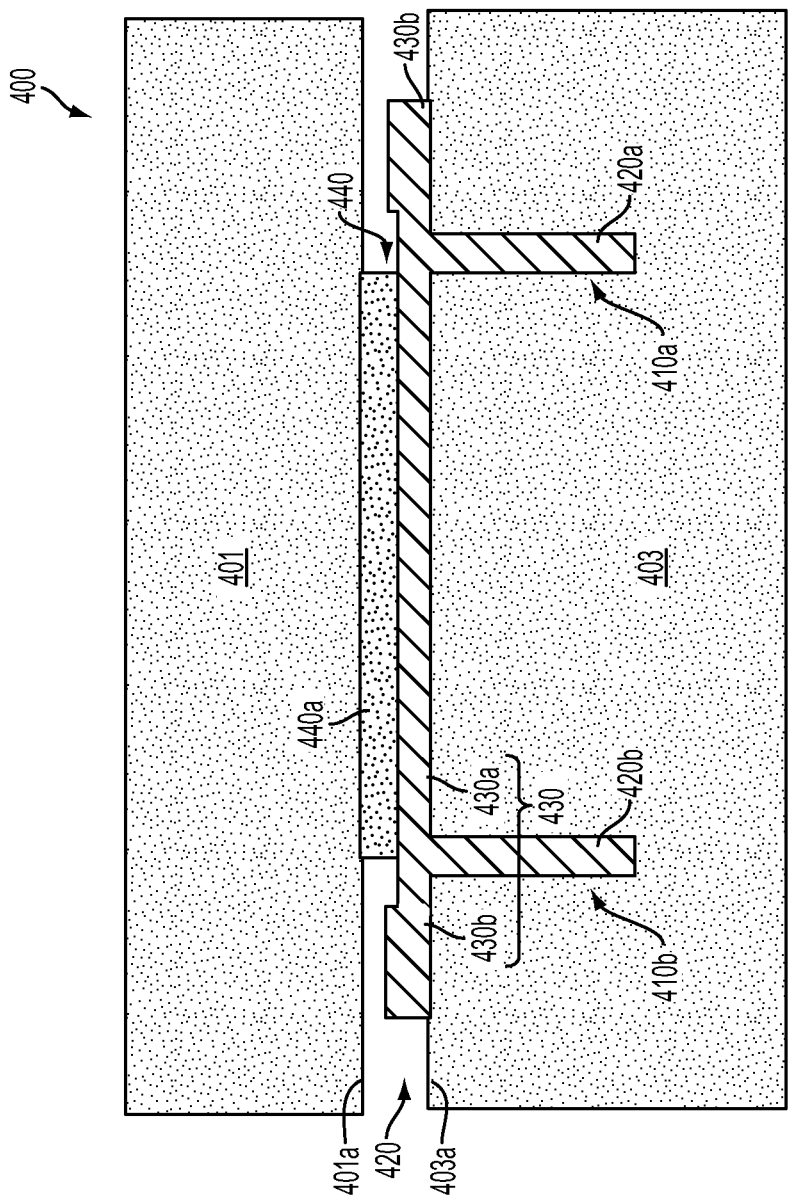

As noted, the openings 410a and 410b are configured to at least partially accommodate the softened metallic material 430 during the eutectic bonding. In some embodiments, the softened metallic material 430 may not flow into the openings 410a and 410b as shown in FIG. 4B. In other embodiments, the softened metallic material 430 may completely fill the openings 410a and 410b as shown in FIG. 4D. The metallic materials of the pad 430a and the guard ring 430b may adjoin each other. In still other embodiments, the softened metallic material 430 may partially fill the openings 410a and 410b (not shown). It is noted that the number of the openings 410a and 410b described above is merely exemplary. In some embodiments, more openings can be formed in the substrate 403 for accommodating the metallic material 430.

In some embodiments, the openings 410a and 410b can continuously extend into the surface 403a of the substrate 403, such that the openings 410a and 410b can meet each other. In other embodiments, the openings 410a and 410b can be discontinuously disposed in the substrate 403. In still other embodiments, the openings 410a and 410b can be trench openings. In some embodiments, the openings 410a and 410b do not penetrate all the way through the substrate 403. In some embodiments, the openings 410a and 410b can each have a depth ranging from about 2 μm to about 10 μm. The openings 410a and 410b can each have a width ranging from about 1 μm to about 2 μm. It is noted that the dimensions of the openings 410a and 410b are merely exemplary. The dimensions can be modified.

Figure 5:
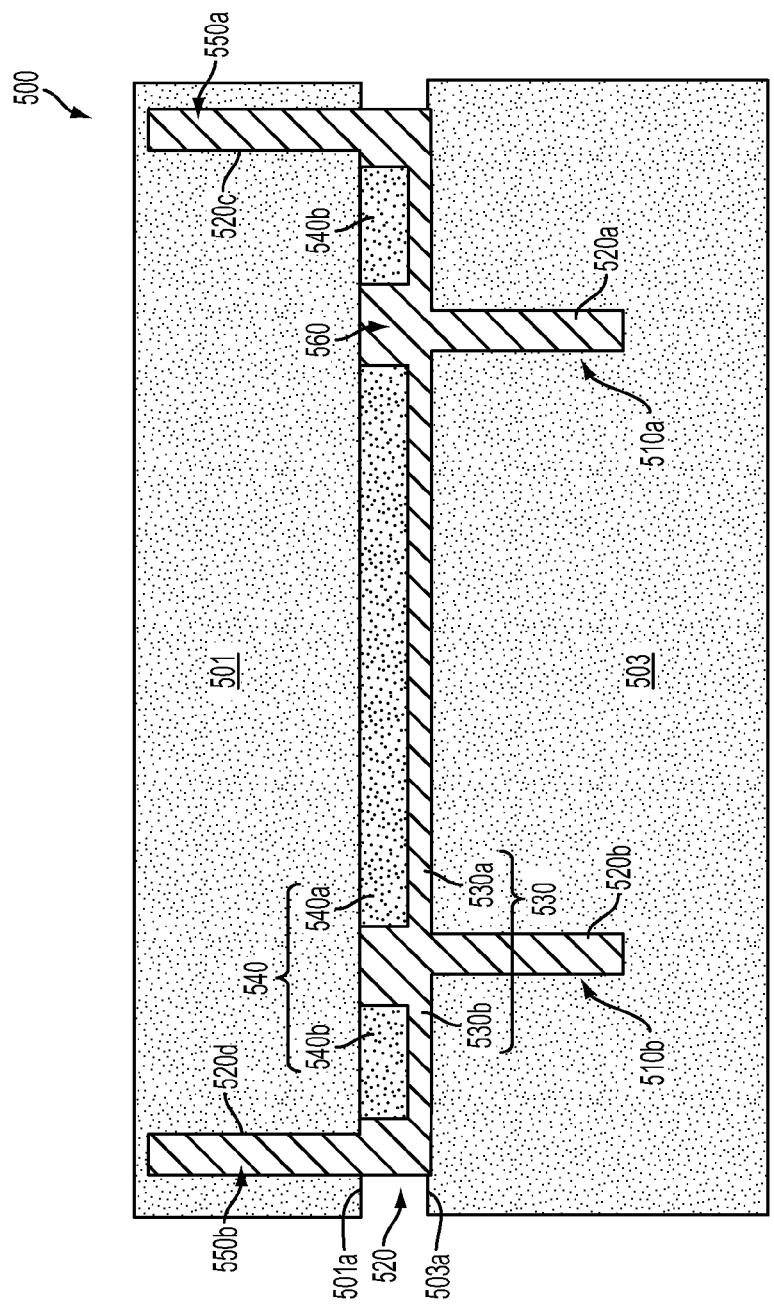

In some embodiments, the semiconductor material can optionally include at least one semiconductor guard ring that is disposed around the semiconductor pad. For example, at least one guard ring, e.g., a guard ring 540b can be disposed around the pad 540a as shown in FIG. 5. Items of FIG. 5 that are the same or similar items in FIG. 1 are indicated by the same reference numerals, increased by 400. In FIG. 5, a package system 500 can include a substrate 501 that can be electrically coupled with a substrate 503. In some embodiments, a gap 560 can be between the pad 540a and the guard ring 540b.

In some embodiments, the guard ring 540b can be continuously or discontinuously disposed around the pad 540a. In some embodiments, the guard ring 540b can provide more semiconductor materials to interact with the metallic material 530 that is softened and/or melted during the eutectic bonding. Though merely showing a single guard ring 540b in FIG. 5, the scope of this application is not limited thereto. In some embodiments, more than one guard ring can be disposed around the pad 540a.

In some embodiments, the substrate 501 can optionally include at least one opening, e.g., openings 550a and 550b through a surface 501a. The openings 550a and 550b can be configured to at least partially accommodate a portion, e.g., portions 520c and 520d, respectively, of the electrical bonding material 520. In some embodiments, the openings 550a and 550b can continuously extend into the surface 501a of the substrate 501, such that the openings 550a and 550b can meet each other. In other embodiments, the openings 550a and 550b can be discontinuously disposed into the surface 501a of the substrate 501. In still other embodiments, the openings 550a and 550b can be trench openings. In some embodiments, the openings 550a and 550b do not penetrate all the way through the substrate 501. In other embodiments, the openings 510a and 550a are misaligned from each other in a direction that is perpendicular to surfaces of the substrates 501 and 503. In some embodiments, the openings 550a and 550b can each have a depth ranging from about 2 µm to about 10 µm. The openings 550a and 550b can each have a width ranging from about 1 µm to about 2 µm. It is noted that the dimensions of the openings 550a and 550b are merely exemplary. The dimensions can be modified.

During the eutectic bonding, the metallic material 530 can be softened and/or melted. The openings 550a and 550b are configured to at least partially accommodate the softened metallic material 530. In some embodiments, the softened metallic material 530 can completely fill the openings 550a and 550b as shown in FIG. 5. In other embodiments, the softened metallic material 530 may partially fill the openings 550a and 550b. It is noted that the number of the openings 550a and 550b is merely exemplary. In some embodiments, more openings can be disposed in the substrate 501 for accommodating the metallic material 530.

It is noted that though showing the openings 550a and 550b disposed around the pad 540a and the guard ring 540b, the scope of the current application is not limited thereto. In some embodiments, the openings 550a and 550b can be disposed around the pad 540a, and the guard ring 540b is saved. In other embodiments, the openings 550a and 550b can be disposed between the pad 540a and the guard ring 540b.

It is noted that the package systems 400 and 500 described above in conjunction with FIGS. 4A-4D and 6 can be formed by methods or modification that are as same as or similar to the methods described above in conjunction with FIGS. 2 and 3A-3F. The detail description is not repeated.

One aspect of this description relates to a package system. The package system includes a first substrate; and a second substrate electrically coupled with the first substrate. The package system further includes a semiconductor material between the first substrate and the second substrate. The semiconductor material includes a pad, and at least one guard ring surrounding the pad and spaced from the pad. The package system further includes a metallic material bonded to the semiconductor material, wherein the metallic material at least partially fills at least one opening in at least one of the first substrate or the second substrate.

Another aspect of this description relates to a package system. The package system includes a first substrate; and a second substrate electrically coupled with the first substrate. The package system further includes a semiconductor material between the first substrate and the second substrate. The semiconductor material includes a plurality of pads, and a plurality of guard rings, wherein each guard ring of the plurality of guard rings surrounds a corresponding pad of the plurality of pads. The package system further includes a metallic material bonded to the semiconductor material, wherein the metallic material comprises a plurality of metallic regions, and each metallic region of the plurality of metallic regions at least partially fills at least one opening of a plurality of openings in the first substrate or the second substrate.

Still another aspect of this description relates to a package system. The package system includes a first substrate comprises a first integrated circuit; and a second substrate electrically coupled with the first substrate. The package system further includes a semiconductor material between the first substrate and the second substrate, wherein the semiconductor material comprises a pad. The package system further includes a metallic material bonded to the semiconductor material, wherein the metallic material at least partially fills at least one opening in at least one of the first substrate or the second substrate. The metallic material includes a metallic pad, and a metallic guard ring surrounding the metallic pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
   a first substrate;
   a second substrate electrically coupled with the first substrate;
   a semiconductor material between the first substrate and the second substrate, wherein the semiconductor material comprises:
   a pad, and
   at least one guard ring surrounding the pad and spaced from the pad; and
   a metallic material bonded to the semiconductor material, wherein the metallic material at least partially fills at least one opening in at least one of the first substrate or the second substrate.

2. The package system of claim 1, wherein the metallic material extends into a space between the at least one guard ring and the pad.

3. The package system of claim 1, wherein the at least one opening comprises:
   a first opening in the first substrate; and
   a second opening in the second substrate, wherein the metallic material is within both the first opening and the second opening.

4. The package system of claim 3, wherein the first opening is closer to a center of the package system than an inside edge of the at least one guard ring.

5. The package system of claim 3, wherein the first opening is farther from a center of the package system than an outer edger of the at least one guard ring.

6. The package system of claim 3, wherein the second opening is closer to a center of the package system than an inside edge of the at least one guard ring.

7. The package system of claim 3, wherein the second opening is farther from a center of the package system than an outer edger of the at least one guard ring.

8. The package system of claim 1, wherein the at least one opening comprises a plurality of discontinuous openings in at least one of the first substrate or the second substrate.

9. The package system of claim 1, wherein the at least one opening comprises a continuous opening in at least one of the first substrate or the second substrate, and the continuous opening is farther from a center of the package system than an outer edge of the pad.

10. A package system comprising:
a first substrate;
a second substrate electrically coupled with the first substrate;
a semiconductor material between the first substrate and the second substrate, wherein the semiconductor material comprises:
a plurality of pads, and
a plurality of guard rings, wherein each guard ring of the plurality of guard rings surrounds a corresponding pad of the plurality of pads; and
a metallic material bonded to the semiconductor material, wherein the metallic material comprises a plurality of metallic regions, and each metallic region of the plurality of metallic regions at least partially fills at least one opening of a plurality of openings in the first substrate or the second substrate.

11. The package system of claim 10, wherein each metallic region of the plurality of metallic regions are separated from other metallic regions of the plurality of metallic regions.

12. The package system of claim 10, wherein at least one of the first substrate or the second substrate comprises an integrated circuit.

13. The package system of claim 10, wherein the plurality of openings includes a first plurality of openings in the first substrate and a second plurality of openings in the second substrate.

14. A package system comprising:
a first substrate comprises a first integrated circuit;
a second substrate electrically coupled with the first substrate;
a semiconductor material between the first substrate and the second substrate, wherein the semiconductor material comprises a pad; and
a metallic material bonded to the semiconductor material, wherein the metallic material at least partially fills at least one opening in at least one of the first substrate or the second substrate, and the metallic material comprises:
a metallic pad, and
a metallic guard ring surrounding the metallic pad.

15. The package system of claim 14, wherein the second substrate comprises a second integrated circuit.

16. The package system of claim 14, wherein the second substrate comprises conductive wire routing.

17. The package system of claim 14, wherein the metallic pad is continuous with the metallic guard ring.

18. The package system of claim 14, wherein the at least one opening is between the metallic pad and the metallic guard ring.

19. The package system of claim 14, wherein the at least one opening comprises a plurality of discontinuous openings.

20. The package system of claim 14, wherein the at least one opening has a depth ranging from about 1 micron (μm) to about 2 μm.

* * * * *